United States Patent
Tabery et al.

(10) Patent No.: US 7,029,958 B2
(45) Date of Patent: Apr. 18, 2006

(54) SELF ALIGNED DAMASCENE GATE

(75) Inventors: Cyrus E. Tabery, Santa Clara, CA (US); Shibly S. Ahmed, San Jose, CA (US); Matthew S. Buynoski, Palo Alto, CA (US); Srikanteswara Dakshina-Murthy, Wappingers Falls, NY (US); Zoran Krivokapic, Santa Clara, CA (US); Haihong Wang, Milpitas, CA (US); Chih-Yuh Yang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 91 days.

(21) Appl. No.: 10/699,887

(22) Filed: Nov. 4, 2003

(65) Prior Publication Data

US 2005/0104091 A1 May 19, 2005

(51) Int. Cl.
*H01L 21/00* (2006.01)

(52) U.S. Cl. .................. 438/151; 438/163; 438/279; 438/303

(58) Field of Classification Search ............... 438/151, 438/157, 163, 279, 283, 299, 301, 303
See application file for complete search history.

(56) References Cited

U.S. PATENT DOCUMENTS

| | | | |
|---|---|---|---|
| 5,757,038 A | 5/1998 | Tiwari et al. | |
| 6,300,182 B1 | 10/2001 | Yu | |
| 6,329,124 B1 | 12/2001 | Rangarajan et al. | 430/313 |
| 6,458,662 B1 | 10/2002 | Yu | |
| 6,475,869 B1 | 11/2002 | Yu | |
| 6,514,849 B1 | 2/2003 | Hui et al. | 438/618 |
| 6,583,469 B1 | 6/2003 | Fried et al. | 438/151 |
| 6,630,388 B1 | 10/2003 | Sekigawa et al. | 438/396 |
| 6,642,090 B1 | 11/2003 | Fried et al. | 438/164 |
| 6,645,797 B1 | 11/2003 | Buynoski et al. | 438/157 |
| 6,657,252 B1 | 12/2003 | Fried et al. | 257/316 |
| 6,657,259 B1 | 12/2003 | Fried et al. | 257/350 |
| 6,706,571 B1 | 3/2004 | Yu et al. | 438/157 |
| 6,709,982 B1 | 3/2004 | Buynoski et al. | 438/696 |
| 6,762,483 B1 * | 7/2004 | Krivokapic et al. | 257/618 |
| 6,764,884 B1 * | 7/2004 | Yu et al. | 438/157 |

(Continued)

FOREIGN PATENT DOCUMENTS

EP 1 202 335 5/2002

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Kevin M. Picardat
(74) *Attorney, Agent, or Firm*—Harrity Snyder, LLP

(57) ABSTRACT

A method for forming a metal-oxide semiconductor field-effect transistor (MOSFET) includes patterning a fin area, a source region, and a drain region on a substrate, forming a fin in the fin area, and forming a mask in the fin area. The method further includes etching the mask to expose a channel area of the MOSFET, etching the fin to thin a width of the fin in the channel area, forming a gate over the fin, and forming contacts to the gate, the source region, and the drain region.

17 Claims, 17 Drawing Sheets

U.S. PATENT DOCUMENTS

| | | | |
|---|---|---|---|
| 6,787,476 | B1 | 9/2004 | Dakshina-Murthy et al. .... 438/740 |
| 6,855,582 | B1 | 2/2005 | Dakshina-Murthy et al. .... 438/157 |
| 6,864,164 | B1 | 3/2005 | Dakshina-Murthy et al. .... 438/585 |
| 2002/0130354 | A1 | 9/2002 | Ishii et al. |
| 2002/0140039 | A1 | 10/2002 | Ballantine et al. |
| 2003/0042531 | A1 | 3/2003 | Lee et al. |
| 2004/0048424 | A1 | 3/2004 | Wu et al. |
| 2004/0266076 | A1* | 12/2004 | Doris et al. .................. 438/157 |
| 2005/0057964 | A1* | 3/2005 | Mathew et al. ............. 365/177 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

U.S. Appl. No. 10/348,910; filed Jan. 23, 2003; entitled: "Narrow Fin FinFET," 29 pages.

U.S. Appl. No. 10/614,052; filed Jul. 8, 2003; entitled: "Narrow Fins by Oxidation in Double-Gate FinFET," 18 pages.

Co-pending U.S. Appl. No. 10/830,006 filed Apr. 23, 2004 entitled: "Narrow Fin FinFET," 15 page specification, 13 sheets of drawings.

* cited by examiner

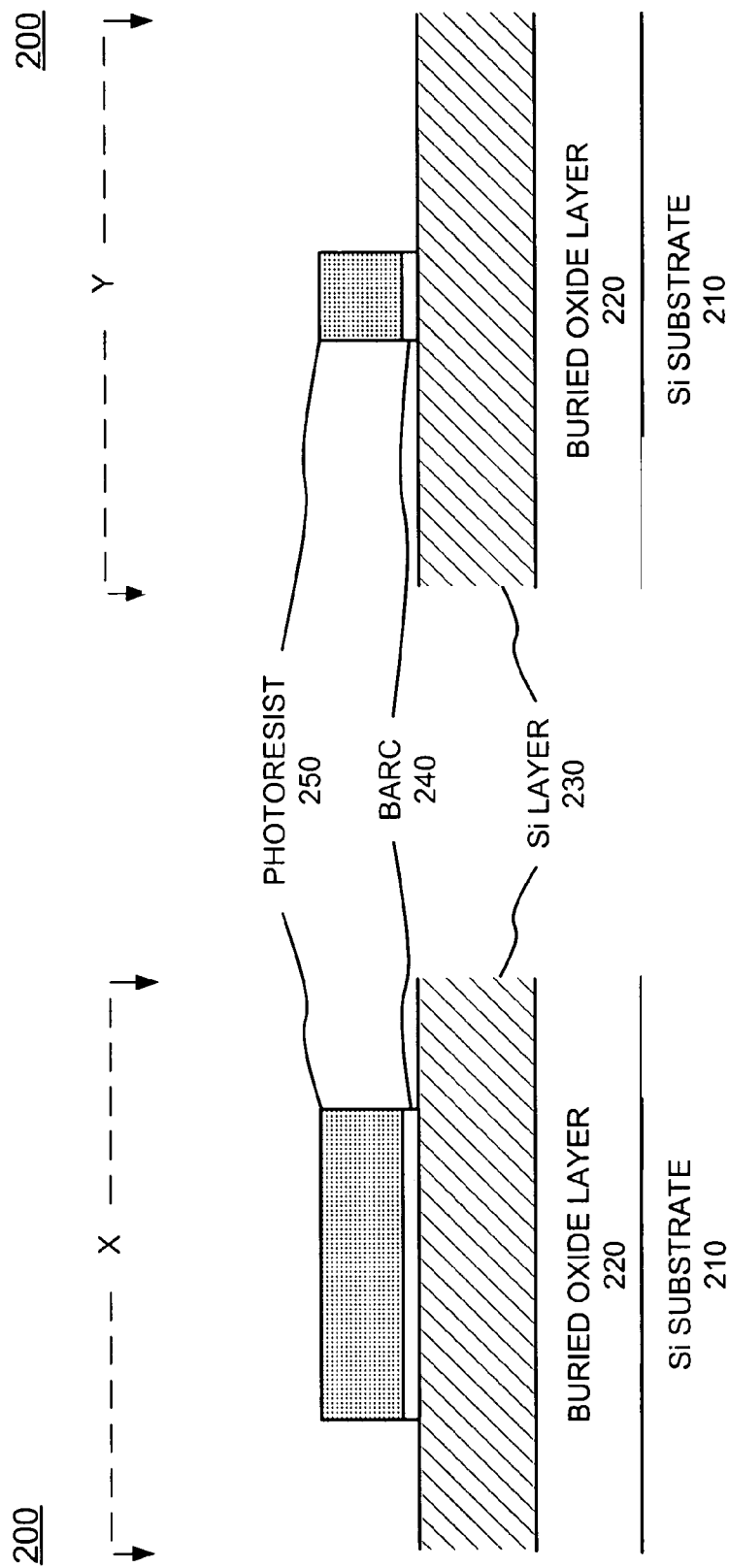

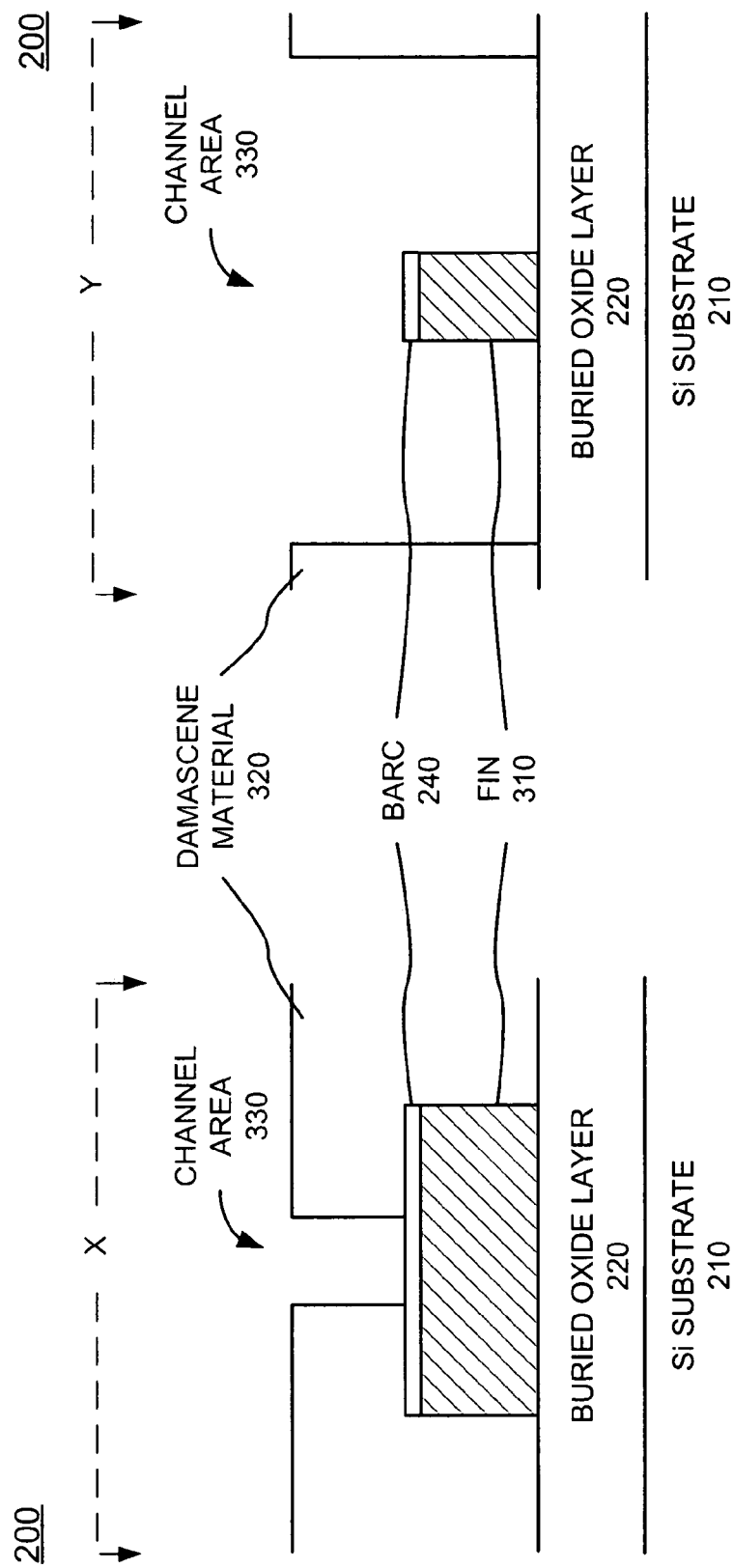

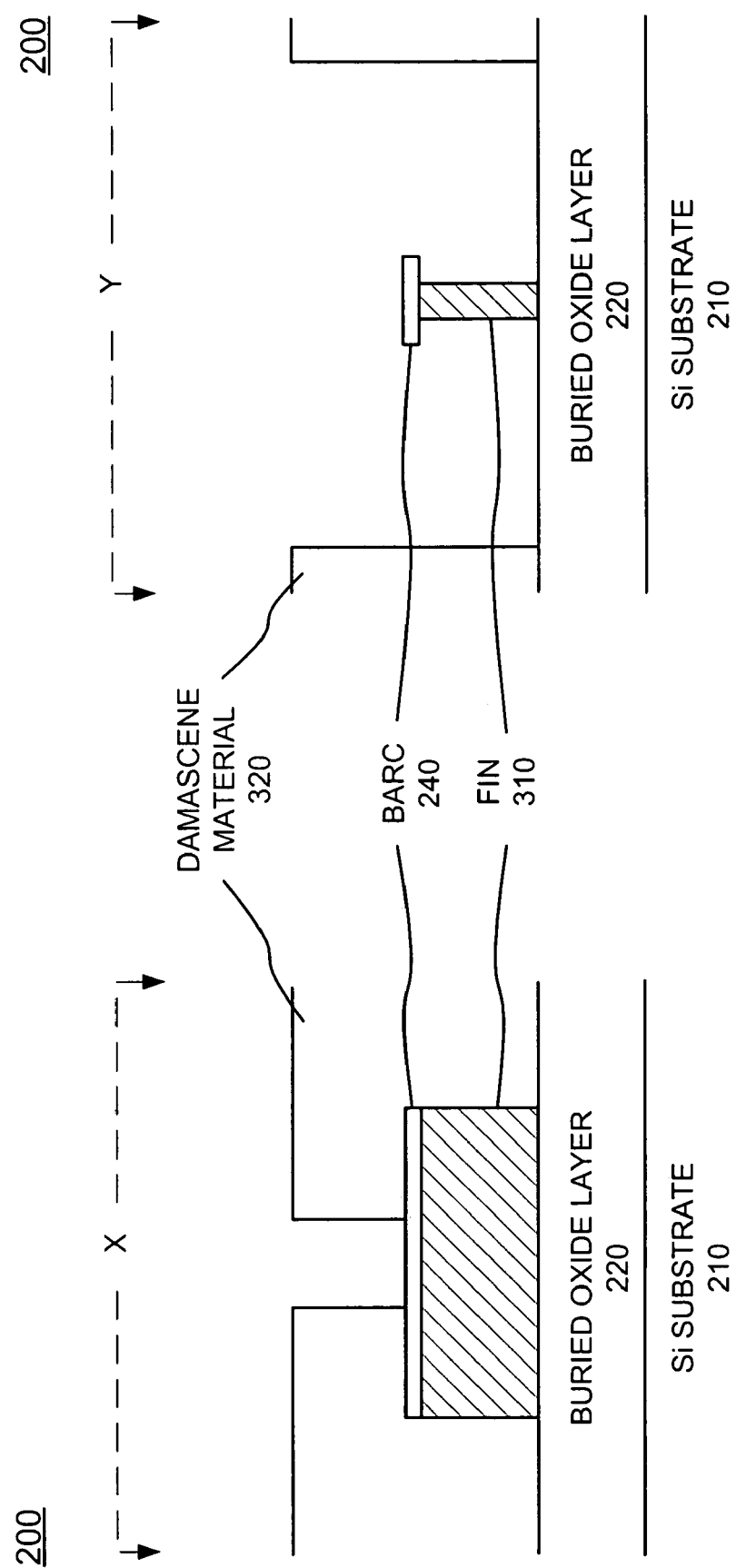

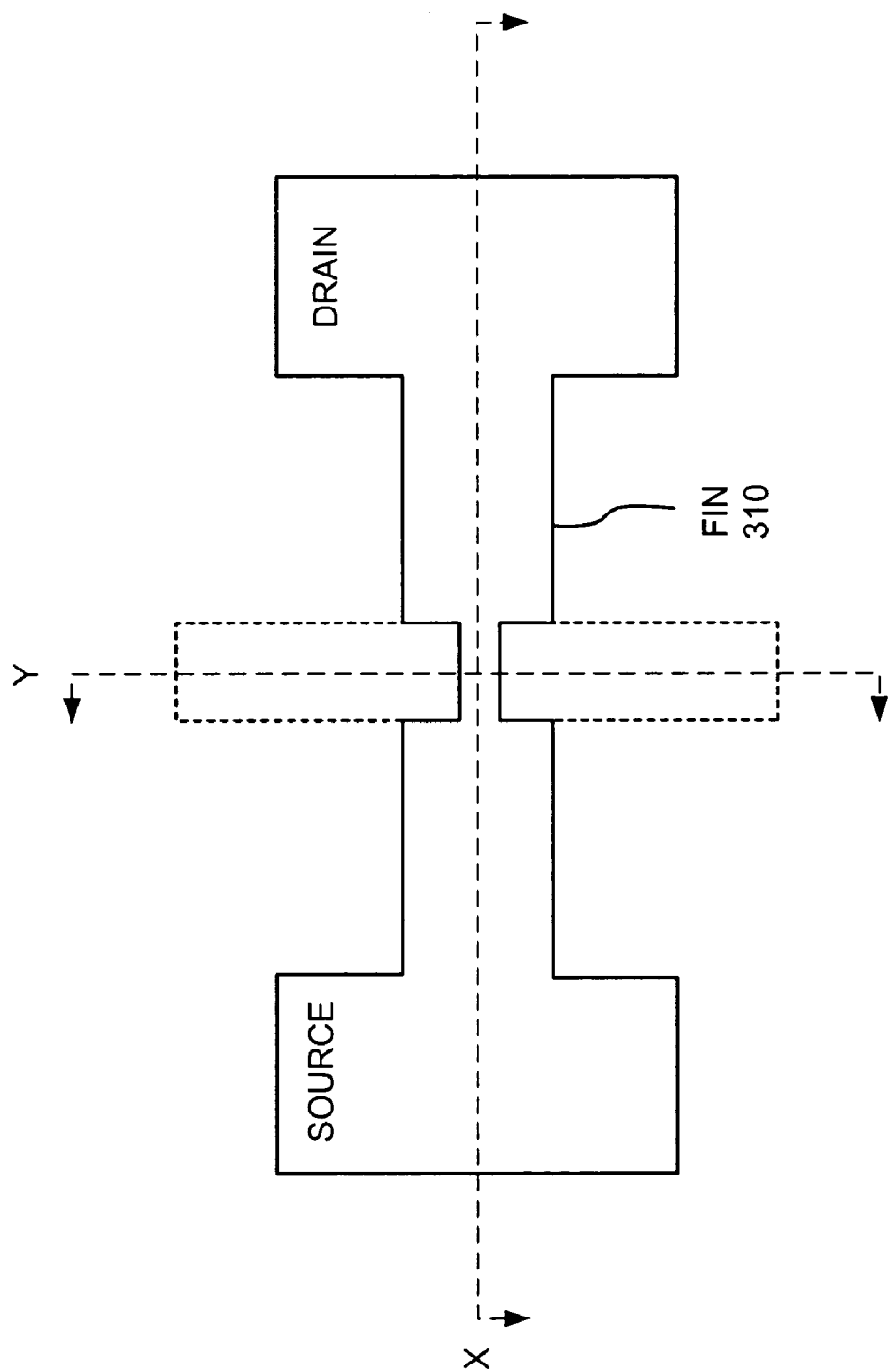

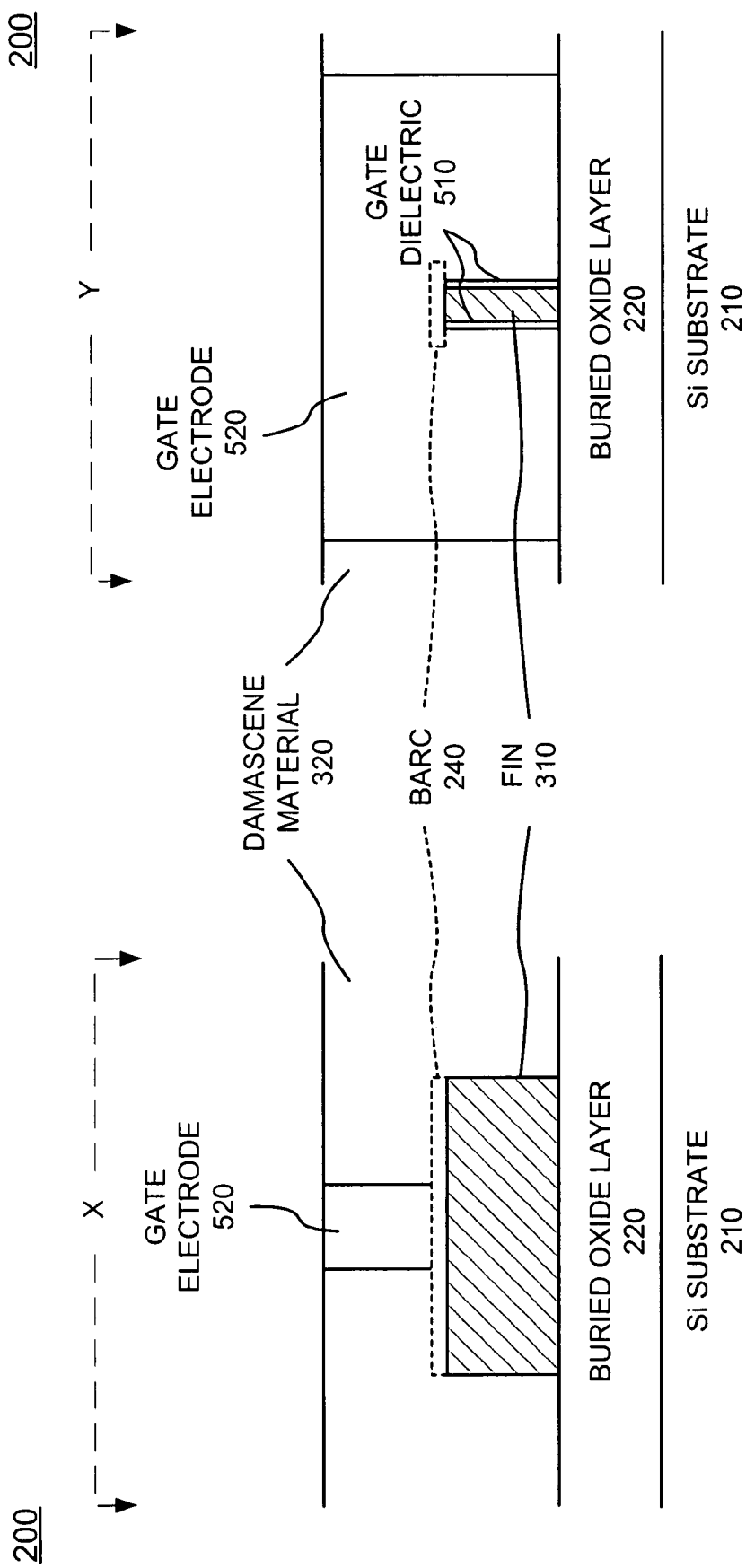

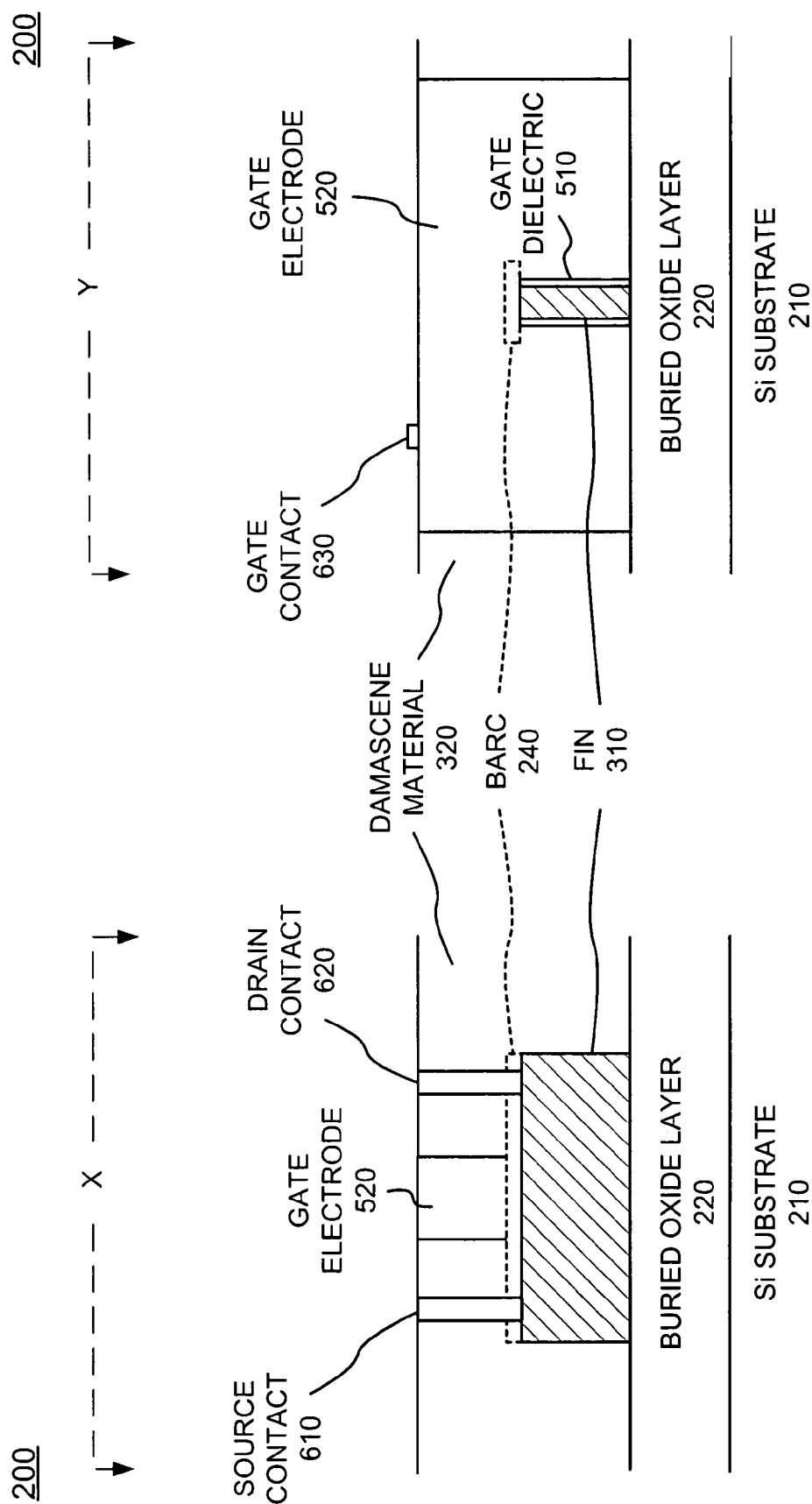

SELF ALIGNED DAMASCENE GATE

FIELD OF THE INVENTION

The present invention relates generally to semiconductor devices and, more particularly, to metal-oxide semiconductor field-effect transistor (MOSFET) devices with a self aligned damascene gate and methods of making these devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices below the 0.1 μm process generation may be difficult, if not impossible. New device structures and new materials, thus, are likely to be needed to improve FET performance.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide FinFET devices that include a damascene gate formed with a self aligned gate mask and methods for manufacturing these devices.

In one aspect consistent with the principles of the invention, a method for forming a metal-oxide semiconductor field-effect transistor (MOSFET) includes patterning a fin area, a source region, and a drain region on a substrate, forming a fin in the fin area, and forming a mask in the fin area. The method further includes etching the mask to expose a channel area of the MOSFET, etching the fin to thin a width of the fin in the channel area, forming a gate over the fin, and forming contacts to the gate, the source region, and the drain region.

In another aspect consistent with the principles of the invention, a method for forming a MOSFET includes forming a fin on a substrate; forming a mask on the substrate; etching the mask to expose a channel area of the MOSFET; thinning a width of the fin in the channel area; and forming a gate over the fin, where the gate extends on each side of the fin.

In yet another aspect consistent with the principles of the invention, a MOSFET includes a fin having a width of approximately 100 Å to 400 Å formed on a substrate, a gate dielectric formed on side surfaces of the fin, and a gate electrode formed covering the fin.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 2A–6C illustrate exemplary top and cross-sectional views of a MOSFET fabricated according to the processing described in FIG. 1;

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide FinFET devices that include a self aligned damascene gate and methods for manufacturing these devices. Such FinFET devices have certain advantages. For example, only the active area of the fin is at the minimum channel length, which reduces source/drain resistance. The gate is also self aligned to the minimum channel area, which significantly reduces the parasitic source/drain resistance of the device. In traditional FinFET approaches, the narrow channel is usually significantly longer than the gate length in order to account for gate-to-fin overlay tolerance. Also, the gate patterning is done on a planar substrate (e.g., a polished damascene material), which provides increased lithography margin since the depth of focus of aggressive lithography schemes tends to be quite low. Also, critical dimension variation due to changes in resist thickness over topography (i.e., CD swing0 can be avoided since the resist coating is on a planarized surface.

Exemplary Mosfet

Figure 1:
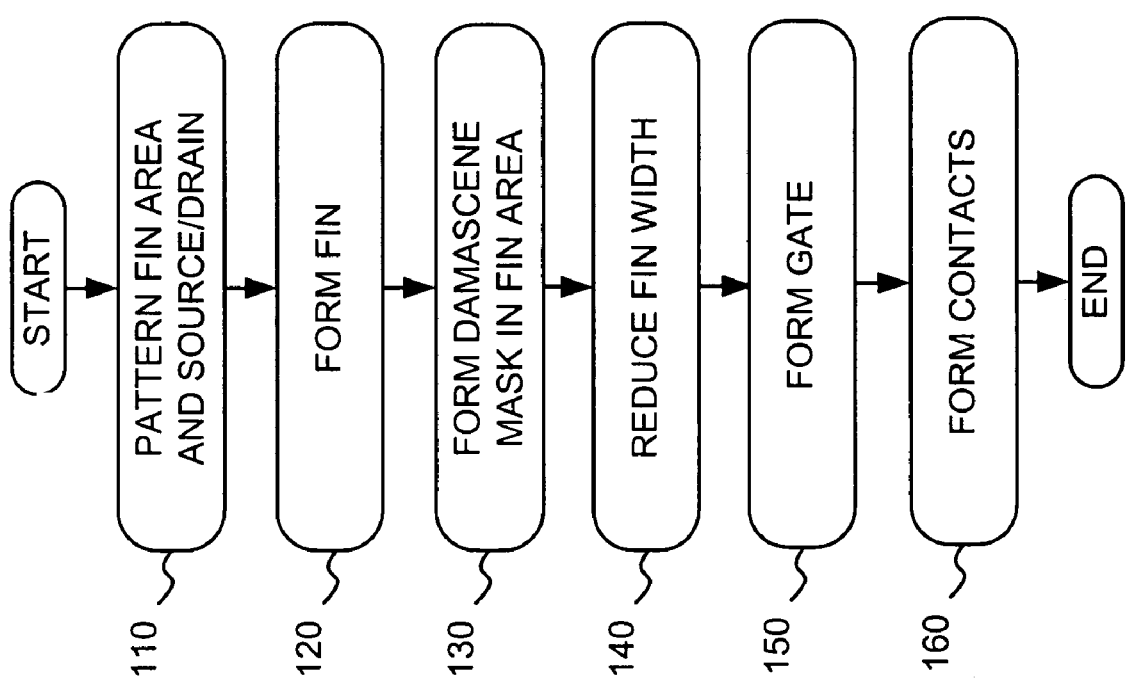
FIG. 1 illustrates an exemplary process for fabricating a MOSFET in accordance with an implementation consistent with the principles of the invention.

FIG. 1 illustrates an exemplary process for fabricating a MOSFET in accordance with an implementation consistent with the principles of the invention. FIGS. 2A–6C illustrate exemplary top and cross-sectional views of a MOSFET fabricated according to the processing described with regard to FIG. 1.

With reference to FIGS. 1 and 2A–2C, processing may begin with semiconductor device 200. As shown in the cross-sectional views in FIGS. 2A and 2B, semiconductor device 200 may include a silicon on insulator (SOI) structure that includes a silicon (Si) substrate 210, a buried oxide layer 220, and a silicon layer 230 on the buried oxide layer 220. Buried oxide layer 220 and silicon layer 230 may be formed on substrate 210 in a conventional manner. The thickness of buried oxide layer 220 may range, for example, from about 1,000 Å to 10,000 Å. The thickness of silicon layer 230 may range, for example, from about 400 Å to 1,500 Å. The silicon thickness may be as thick as possible since increased thickness leads to enhanced width of the device (i.e., more current flow along the sidewall of the fin and thereby higher drive current (in a MOSFET I∝W/L)). Usually it is difficult to use a thick silicon thickness in a conventional FinFET approach since that also leads to a bigger step in the gate lithography step and poor lithography margin.

It will be appreciated that silicon layer 230 is used to form the fin. In alternative implementations, substrate 210 and layer 230 may include other semiconductor materials, such as germanium, or combinations of semiconductor materials, such as silicon-germanium. Buried oxide layer 220 may include a silicon oxide or other types of dielectric materials.

Figure 2C:
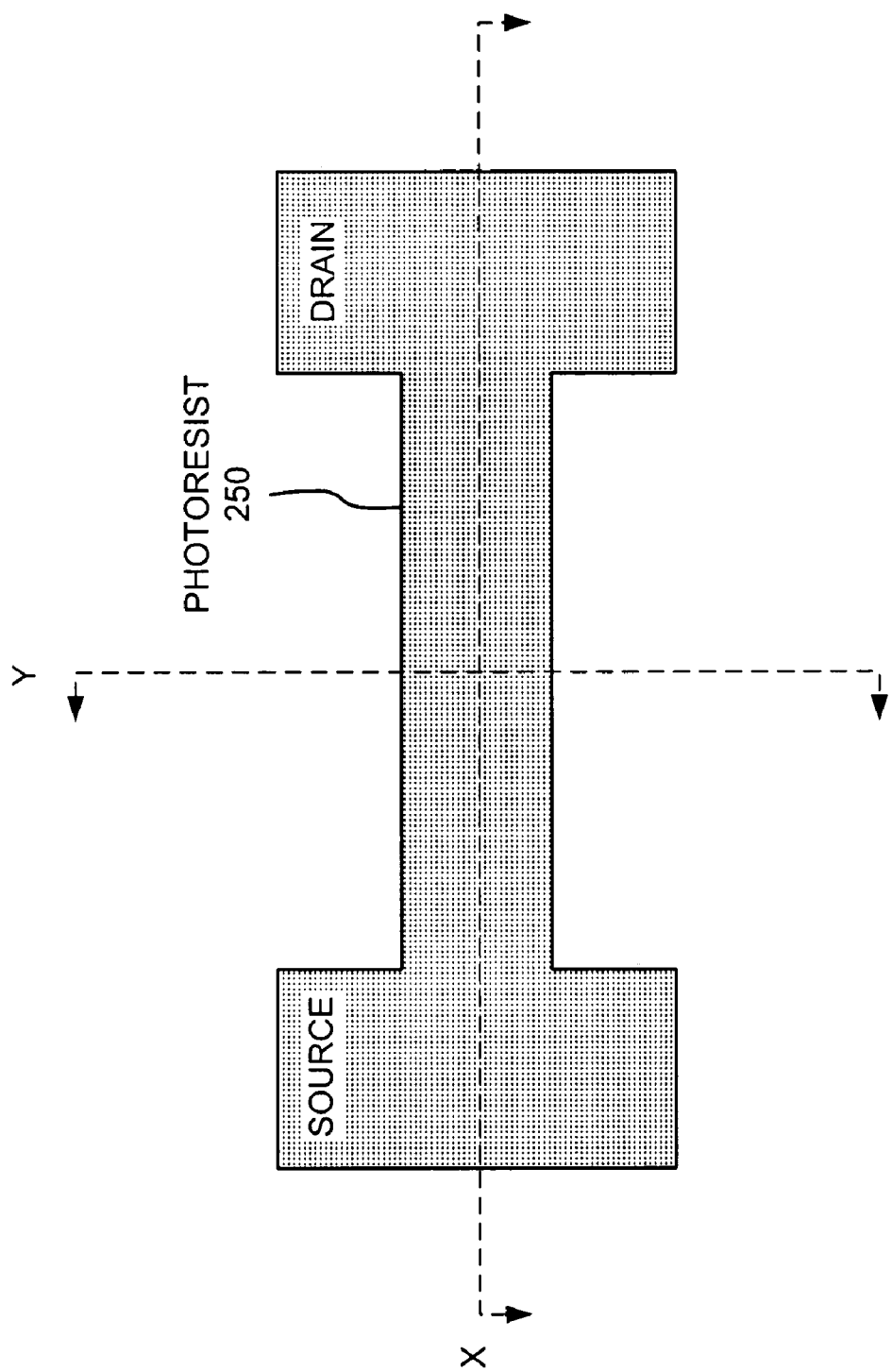

A silicon nitride, or another type of material, may be formed on silicon layer 230 and may function as a bottom antireflective coating (BARC) 240 for subsequent processing, as illustrated in FIGS. 2A and 2B. The thickness of BARC layer 240 may range from approximately 150 Å to 350 Å. A photoresist 250, or the like, may be deposited and patterned to facilitate formation of a large fin area and the source and drain regions (act 110), as shown in FIGS. 2A–2C. Photoresist 250 may be deposited to a thickness ranging from about 1,000 Å to 4,000 Å. FIG. 2C illustrates the top view of semiconductor device-200 of FIGS. 2A and 2B. The cross-section in FIG. 2A is taken along line X in FIG. 2C and the cross-section in FIG. 2B is taken along line Y in FIG. 2C.

Silicon layer 230 may be etched to form a fin 310 (act 120), as shown in FIGS. 3A and 3B. For example, the portion of silicon layer 230 not located under photoresist 250 may be etched with the etching terminating on buried oxide layer 220. Photoresist 250 may then be removed. The width of fin 310, as shown in FIG. 3B, may range from approximately 500 Å to 800 Å.

Figure 3C:
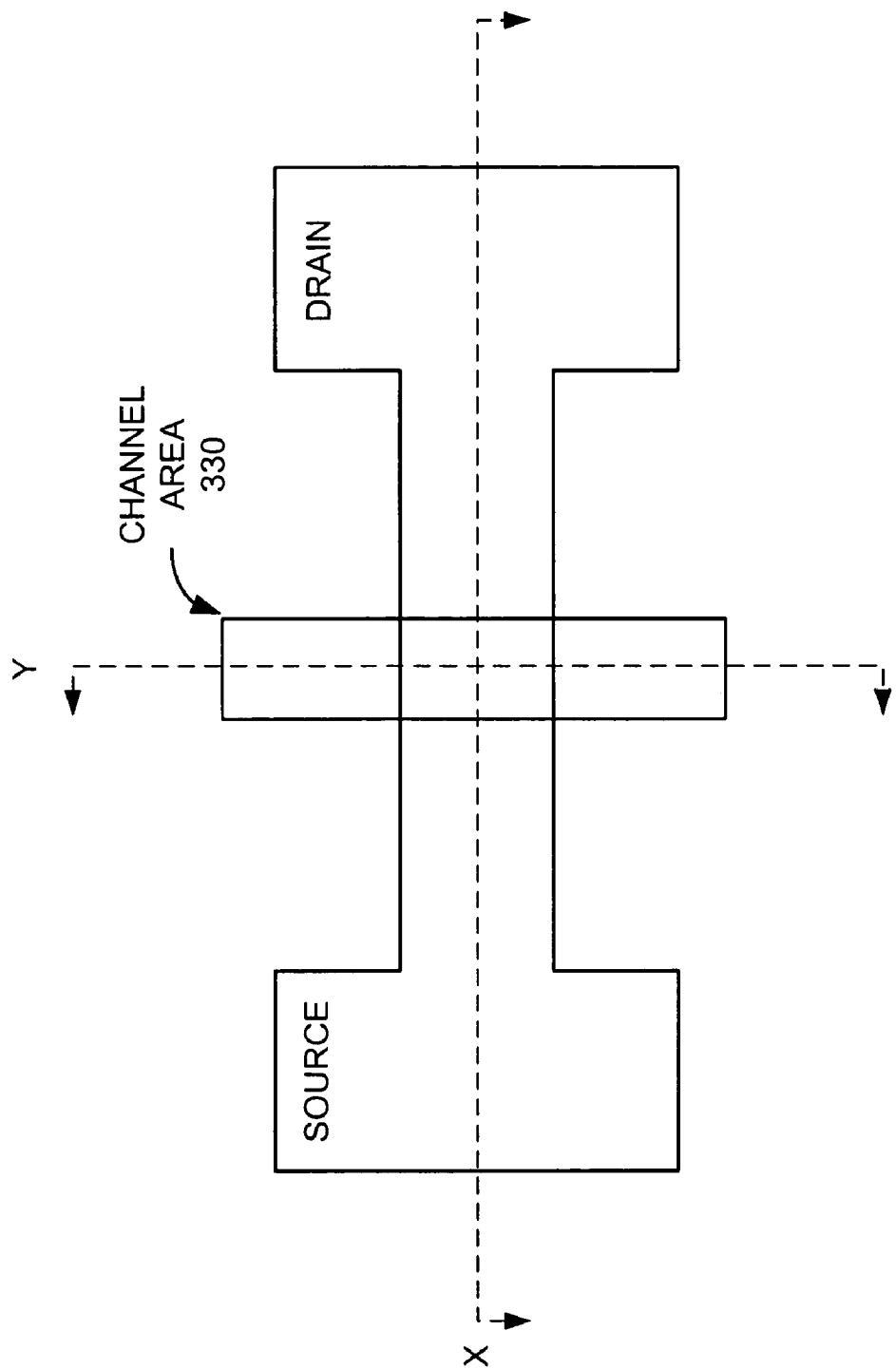

A damascene mask may be formed in the area of fin 310 (act 130), as illustrated in FIGS. 3A–3C. For example, a damascene material 320, such as silicon oxide, silicon nitride, SiCOH, etc., may be deposited over semiconductor device 200 to a thickness ranging from approximately 800 Å to 2,200 Å (to enclose fin 310 and BARC 240) and then polished using known techniques, as illustrated in FIGS. 3A and 3B. Damascene material 320 may function as a BARC for subsequent processing. Damascene material 320 may then be etched using a gate mask to expose a channel area 330 in the gate opening, as shown in FIGS. 3A–3C. The width of channel area 330, as illustrated in FIG. 3C, may range from approximately 300 Å to 500 Å. The gate mask used to expose channel area 330 may be created using aggressive lithography and patterning techniques known to those skilled in the art.

The width of fin 310 may then be reduced (act 140), as illustrated in FIGS. 4A–4C. One or more etching techniques may be used to laterally etch fin 310 in channel area 330. For example, a thermal oxidation of Si followed by a dilute HF dip may be used. Other types of etches may alter natively to be used. For example, Si may be etched in a downstream F plasma where the chemical selectivity of the Si etch in F species over oxide is very high, or a lateral Si etch in HBr based plasma chemistries may be used.

The amount of silicon removed may range from approximately 100 Å to 200 Å per side, as illustrated in FIG. 4B. The resulting width of fin 310 may range from approximately 100 Å to 400 Å. BARC 240 may remain in implementations consistent with the principles of the invention, as illustrated in FIG. 4B. In other implementations, BARC 240 may be removed. FIG. 4C illustrates a top view of semiconductor device 200 after fin 310 has been thinned in channel area 330.

Figure 5C:
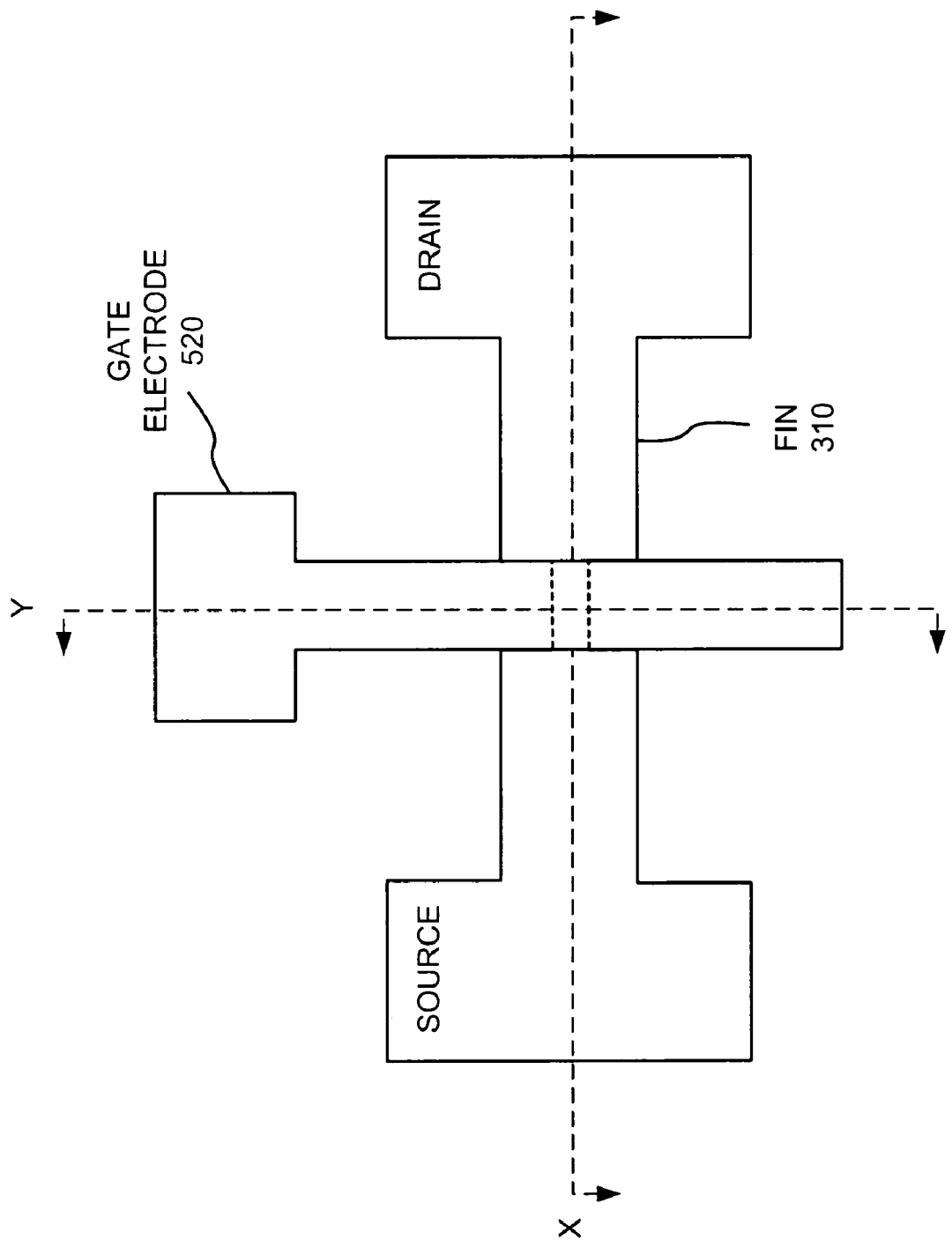

A gate may then be formed (act 150), as illustrated in FIGS. 5A–5C. For example, a gate dielectric material 510 may be deposited or thermally grown on the side surfaces of fin 310 using known techniques, as illustrated in FIG. 5B.

Gate dielectric material 510 may include conventional dielectric materials, such as an oxide (e.g., silicon dioxide), silicon oxy-nitride, or high dielectric constant (high K) materials, such as $HfO_2$. In other implementations, a silicon nitride or other materials may be used to form the gate dielectric. Gate dielectric material 510 may be formed at a thickness ranging from approximately 10 Å to 20 Å.

A gate electrode material 520 may then be deposited over semiconductor device 200 and polished, as illustrated in FIGS. 5A and 5B. Gate electrode material 520 may be polished (e.g., via chemical-mechanical polishing (CMP)) to remove any gate material over damascene material 320, as illustrated in FIGS. 5A and 5B. A number of materials may be used for gate electrode material 520. For example, gate electrode material 520 may include a polycrystalline silicon or other types of conductive material, such as germanium or combinations of silicon and germanium, or metals, such as W, WN, TaN, TiN, etc. Gate electrode material 520 may be formed at a thickness ranging from approximately 700 Å to 2,100 Å, as illustrated in FIG. 5B, which may be approximately equal to the thickness of damascene material 320 (some of which may be lost due to the polishing). FIG. 5C illustrates a top view of semiconductor 200 after gate electrode 520 is formed. The dotted lines in FIG. 5C represent the thinned portion of fin 310. Gate dielectric layer 510 is not illustrated in FIG. 5C for simplicity.

Figure 6C:
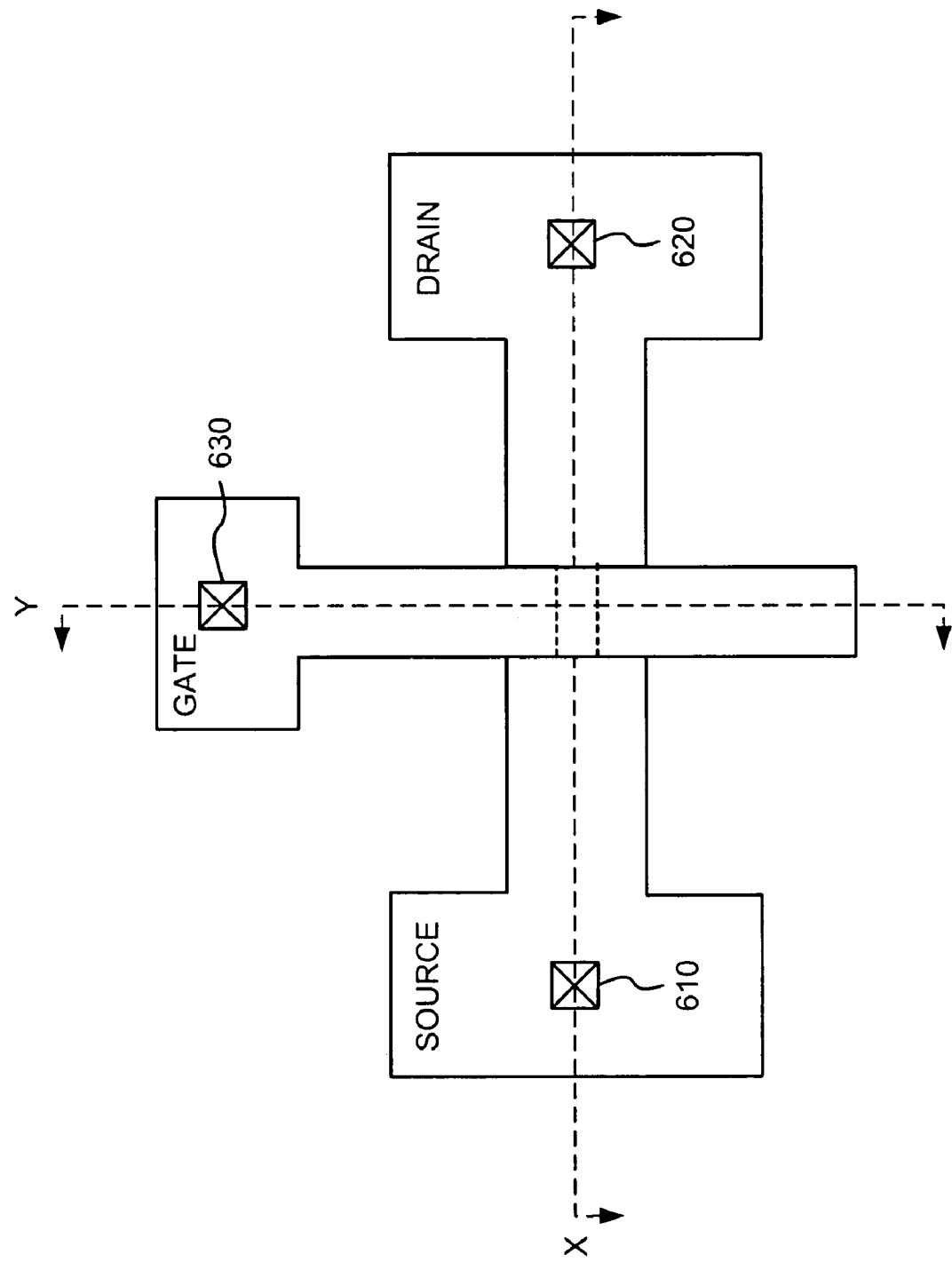

Source, drain, and gate contacts may then be formed (act 160), as illustrated in FIGS. 6A–6C. For example in one implementation, large contact areas may be opened over fin 310 on either side of the gate, as illustrated in FIG. 6A. Source and drain contact areas 610 and 620 may be opened by etching through the extra amount of damascene material 320 left above fin 310 and also removing BARC 240. Gate contact area 630 may also be formed on gate electrode 520. It may be possible for these contact areas 610–630 to be larger than the actual dimensions of fin 310 and the source/drain.

Silicidation, such as $CoSi_2$ or NiSi silicidation, can then occur in these openings. The $CoSi_2$ or NiSi silicidation occurs only where there is polysilicon (i.e., gate) or silicon (i.e., source/drain) and whatever fin region (wide fin) is exposed. The unreacted cobalt or nickel (wherever there is no silicon) can be etched away just as is done in typical self-aligned silicide schemes in use by the industry today.

In another implementation, damascene material 320 and BARC 240 may be removed from the top of fin 310 and the source/drain. Then, a sidewall spacer may be formed on the sides of the gate and fin 310. Next, a silicide metal, such as cobalt or nickel, may be deposited to form a self aligned silicide wherever there is silicon or polysilicon exposed at the top (i.e., on the gate and on the exposed fin channel).

The resulting semiconductor device 200, therefore, may include a self aligned damascene gate formed on either side of fin 310. Fin 310 is thinned in the channel area, as illustrated by the dotted lines in FIG. 6C.

Figure 7A:
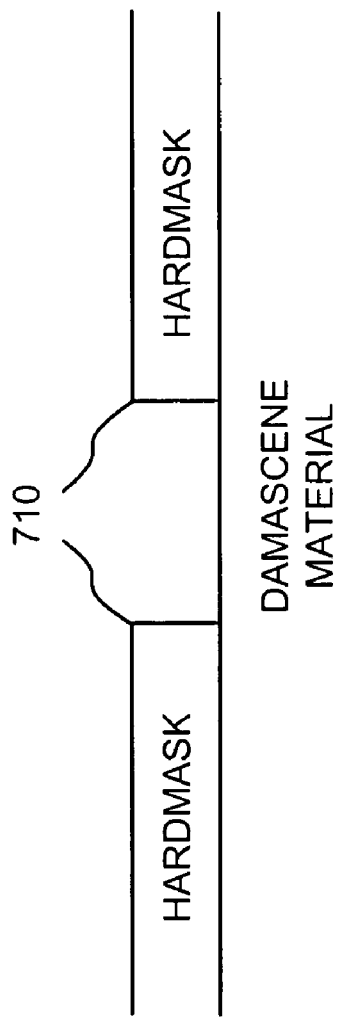
FIGS. 7A–7C illustrate a process for forming spacers according to another implementation consistent with the principles of the invention.
Figure 7B:
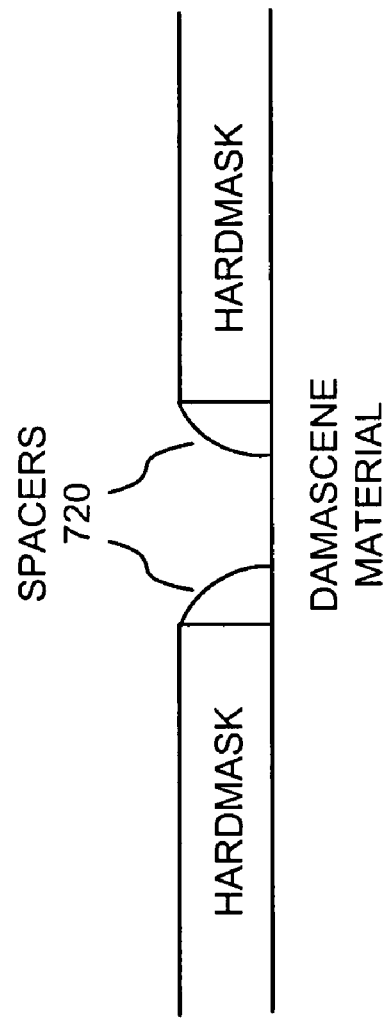
Figure 7C:
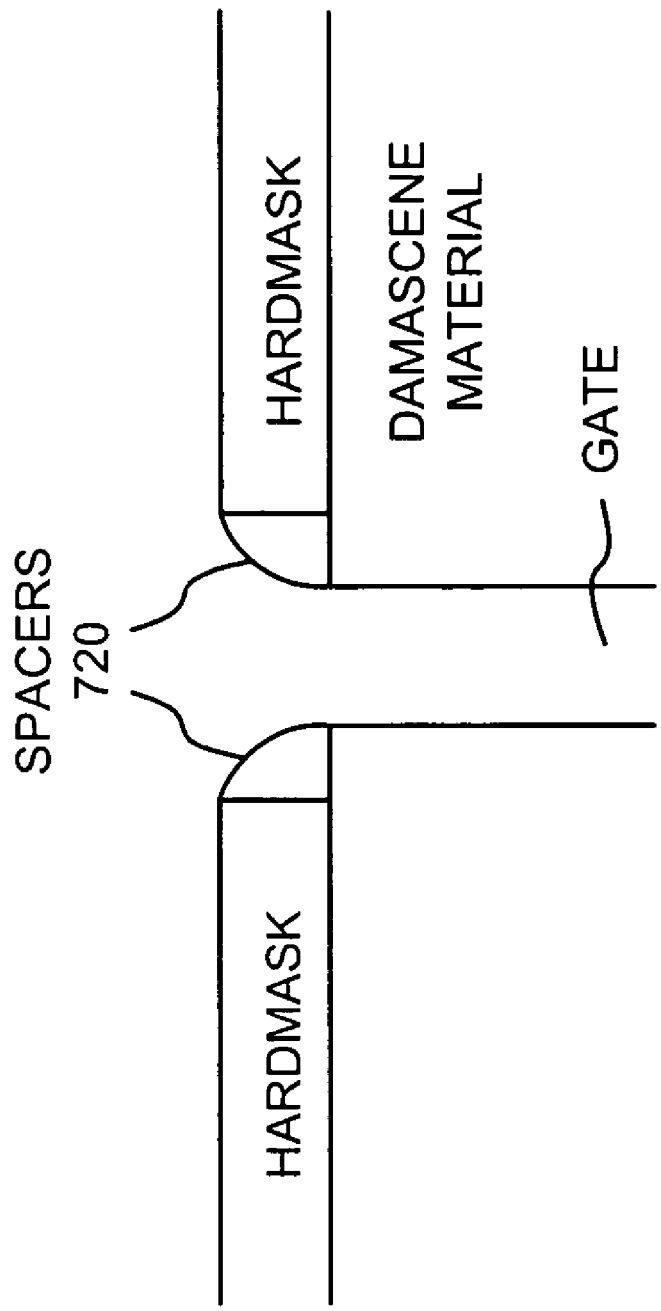

According to another implementation consistent with the principles of the invention, spacers may be formed for the transfer of the damascene gate to make the gate length smaller. FIGS. 7A–7C illustrate an exemplary process for forming spacers according to an alternate implementation consistent with the principles of the invention. As illustrated in FIGS. 7A–7C, a hardmask 710 may be opened (FIG. 7A), spacers 720 may be formed (FIG. 7B), and the transfer of the damascene gate may be performed in the opening (FIG. 7C). The spacer formation inside the damascene gate opening may facilitate printing of small spaces (as mentioned above) in order to form small gate length devices. The spacer technique enables the formation of smaller spaces than may be attained by photolithographic shrinking alone.

In another implementation, damascene gate shrink techniques, such as the ones described in copending, commonly assigned applications entitled, "FINFET GATE FORMATION USING REVERSE TRIM AND OXIDE POLISH" (Ser. No. 10/459,589) (Docket No. H1122), filed Jun. 12, 2003, "FINFET GATE FORMATION USING REVERSE TRIM OF DUMMY GATE" (Ser. No. 10/320,536) (Docket No. H1121), filed Dec. 17, 2002, and "ETCH STOP LAYER FOR ETCHING FINFET GATE OVER A LARGE TOPOGRAPHY" (Ser. No. 10/632,989) (Docket No. H1172), filed Aug. 4, 2003, which are incorporated herein by reference.

In yet another implementation, a metal gate electrode may be used instead of the polysilicon damascene process described above.

Other Implementations

Figure 8A:
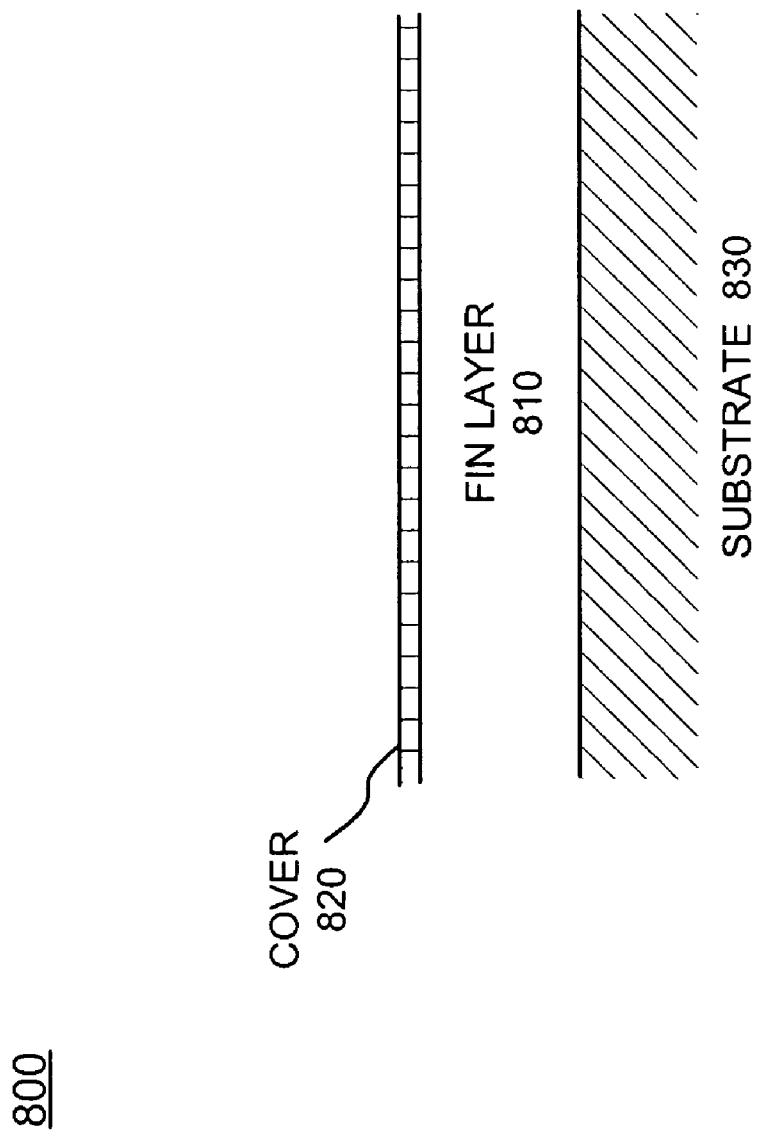
FIGS. 8A–8C illustrate an exemplary process for removing fin sidewall damage.
Figure 8B:
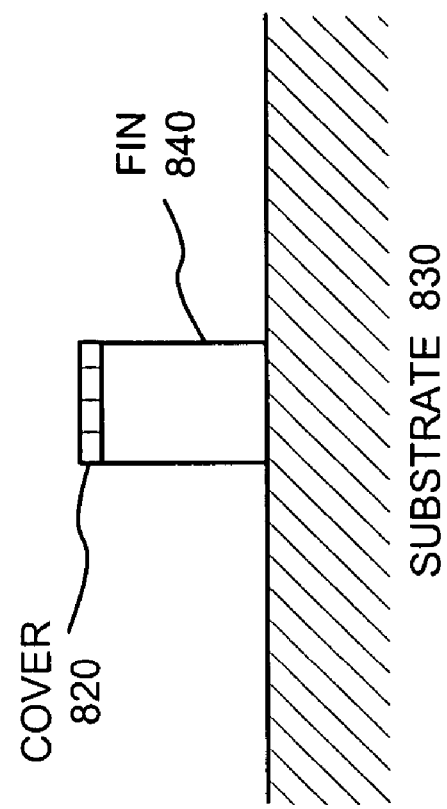
Figure 8C:
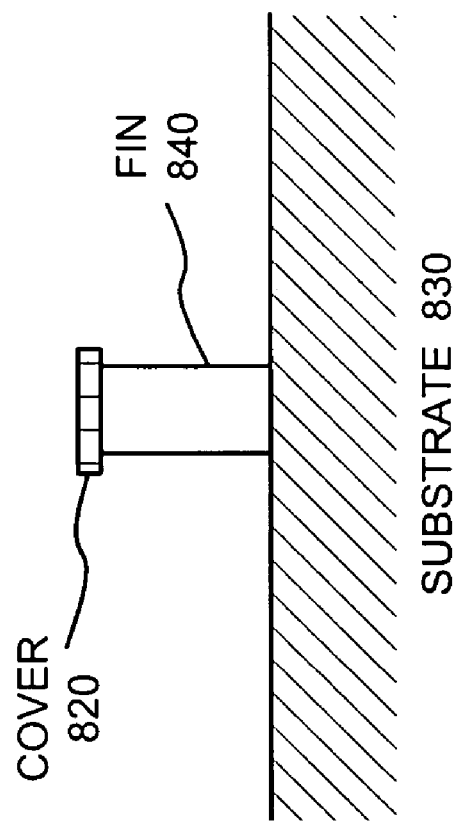

There is a need in the art to remove damage that may occur to the side surfaces (i.e., sidewalls) of a fin during processing. FIGS. 8A–8C illustrate an exemplary process for removing fin sidewall damage. A semiconductor device 800 may include a fin layer 810 and a cover layer 820 formed on a substrate 830, as illustrated in FIG. 8A. Fin layer 810 may include a semiconductor material, such as silicon or germanium, or combinations of semiconductor materials. Cover layer 820 may, for example, include a silicon nitride material or some other type of material capable of protecting fin layer 810 during the fabrication process.

Fin layer 810 and cover layer 820 may be etched using a conventional dry etching technique to form fin 840, as illustrated in FIG. 8B. A conventional wet etching technique may then be used to remove fin sidewall damage, as illustrated in FIG. 8C. During the wet etching, the width of fin 840 may be thinned by approximately 20 Å to 40 Å per side. Wet etching of silicon may also result in some buried oxide loss since it is difficult when wet etching to get good selectivity of silicon to silicon dioxide.

Figure 9:
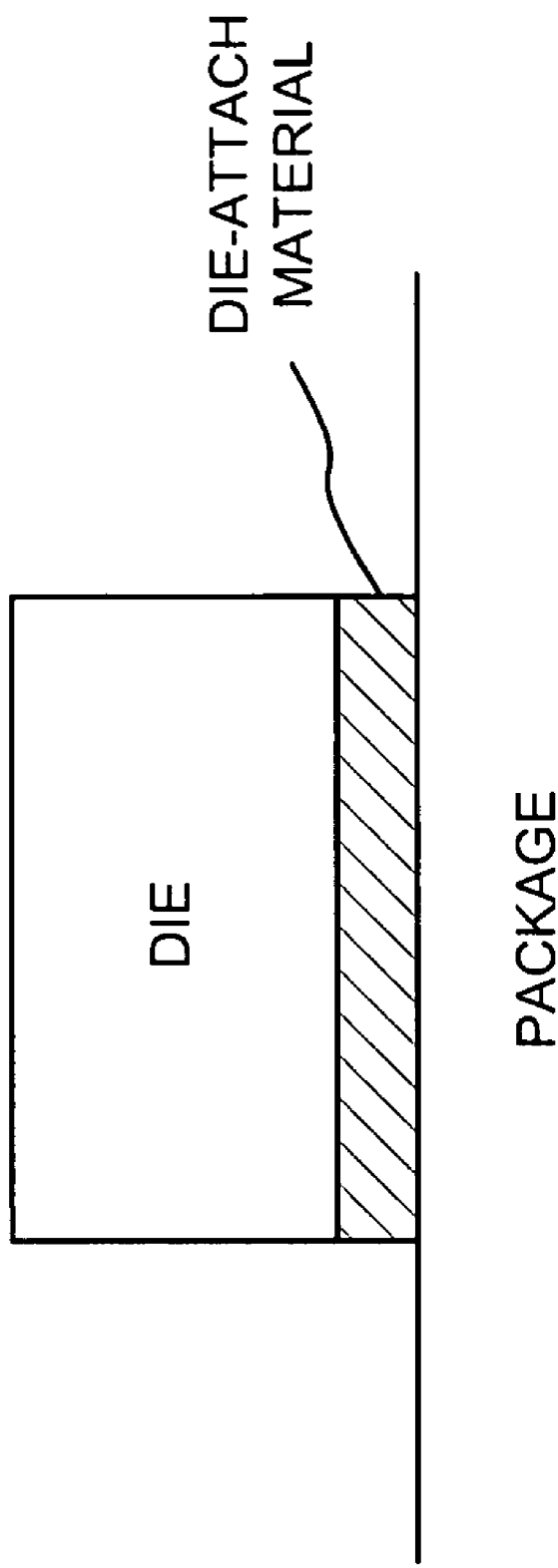
FIG. 9 illustrates an exemplary process for improving mobility of a FinFET device.

There is also a need in the art to improve the mobility of a FinFET device. FIG. 9 illustrates an exemplary process for improving mobility of a FinFET device. A die-attach material may be formed on a package, as illustrated in FIG. 9. The die-attach material may be selected to induce stress (strain) in the FinFET channel. A die may then be attached to the die-attach material, as illustrated in FIG. 9. Tensile stress induced in the silicon FinFET channel may result in enhanced hole mobility, which can help significantly improve PMOS FinFET performance. The die-attach material and process may be such that the residual stress in the silicon layer is tensile. For example, if the package material did not shrink as fast as the silicon layer after the (hot) die attach/solder/bump process, then the silicon layer could be in tensile stress when cooled to lower temperatures.

CONCLUSION

Implementations consistent with the principles of the invention provide FinFET devices that include a damascene gate formed with a self aligned gate mask and methods for manufacturing these devices. These FinFET devices have certain advantages. For example, only the active area of the fin is at the minimum channel length, the gate is self aligned to the minimum channel, and the gate patterning is performed on a planar substrate (e.g., a polished damascene material).

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method for forming a metal-oxide semiconductor field-effect transistor (MOSFET), comprising:
   forming a fin on a substrate;
   forming a mask on the substrate;
   etching the mask to expose a channel area of the MOSFET;
   thinning a width of the fin in the channel area, wherein thinning the width of the fin comprises etching one or more surfaces of the fin using a fluorine (F) plasma process; and
   forming a gate over the fin, the gate extending on each side of the fin.

2. The method of claim 1, wherein the substrate includes a silicon layer on top of a buried oxide layer; and
   wherein the forming a fin includes:
   etching the silicon layer to form the fin.

3. The method of claim 1, further comprising: patterning a fin area, a source area, and a drain area.

4. The method of claim 3, further comprising:
   forming a silicide material on the substrate; and
   forming a gate contact, a source contact, and a drain contact through the silicide material.

5. The method of claim 1, wherein the forming a mask includes: depositing damascene material over the substrate.

6. The method of claim 5, wherein the forming a gate includes:
   etching the damascene material to form a gate area,
   forming a gate dielectric on side surfaces of the fin, and
   depositing gate electrode material to at least partially fill the gate area.

7. The method of claim 6, wherein the gate electrode material comprises at least one of a polysilicon and a metal.

8. The method of claim 1, further comprising:
   forming a silicide material on the gate; and
   forming a gate contact through the silicide material.

9. The method of claim 1, wherein the thinning a width of the fin includes:
   removing approximately 100 Å to 200 Å per side from a width of the fin.

10. The method of claim 1, further comprising:
    forming a silicon oxide material on the fin.

11. The method of claim 10, further comprising:
    removing the silicon oxide material before forming the gate.

12. A method for forming a metal-oxide semiconductor field-effect transistor (MOSFET), comprising:
    patterning a fin area, a source region, and a drain region on a substrate;
    forming a fin in the fin area;
    forming a mask in the fin area;
    etching the mask to expose a channel area of the MOSFET;
    etching the fin to thin a width of the fin in the channel area, wherein etching the fin to thin a width of the fin comprises at least one of:
        using a fluorine (F) plasma process to etch the fin, or
        using a hydrogen bromide (HBr) based plasma chemistry to etch the fin;
    forming a gate over the fin; and
    forming contacts to the gate, the source region, and the drain region.

13. The method of claim 12, wherein the forming contacts includes:
    forming a silicide material on the substrate,
    forming a gate contact through the silicide material,
    forming a source contact through the silicide material, and
    forming a drain contact through the silicide material.

14. The method of claim 12, wherein the forming a mask includes:
    depositing damascene material over the substrate.

15. The method of claim 14, wherein the forming a gate includes:
    etching the damascene material to form a gate region,
    forming a gate dielectric on side surfaces of the fin, and
    depositing gate electrode material to at least partially fill the gate region.

16. The method of claim 12, wherein the etching the fin includes:
    removing approximately 100 Å to 200 Å per side from the width of the fin.

17. A method for forming a metal-oxide semiconductor field-effect transistor (MOSFET), comprising:
    forming a fin on a substrate;
    forming a mask on the substrate;
    etching the mask to expose a channel area of the MOSFET;
    thinning a width of the fin in the channel area, wherein thinning the width of the comprises etching the fin using a hydrogen bromide (HBr) based plasma chemistry; and
    forming a gate over the fin, the gate extending on each side of the fin.

* * * * *